(12) United States Patent
Stejskal et al.

(10) Patent No.: US 10,937,627 B2
(45) Date of Patent: Mar. 2, 2021

(54) MULTI-BEAM ELECTRON MICROSCOPE

(71) Applicant: FEI Company, Hillsboro, OR (US)

(72) Inventors: Pavel Stejskal, Brno (CZ); Petr Hlavenka, Brno (CZ); Bohuslav Sed'a, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/423,670

(22) Filed: May 28, 2019

(65) Prior Publication Data
US 2019/0378681 A1    Dec. 12, 2019

(30) Foreign Application Priority Data
Jun. 7, 2018  (EP) .................................. 18176596

(51) Int. Cl.
*H01J 37/244*   (2006.01)
*H01J 37/20*    (2006.01)
*H01J 37/28*    (2006.01)

(52) U.S. Cl.
CPC ........... *H01J 37/244* (2013.01); *H01J 37/20* (2013.01); *H01J 37/28* (2013.01); *H01J 2237/202* (2013.01); *H01J 2237/2441* (2013.01); *H01J 2237/2443* (2013.01); *H01J 2237/24475* (2013.01)

(58) Field of Classification Search
CPC .......... H01J 37/244; H01J 37/20; H01J 37/28; H01J 2237/202; H01J 2237/2441; H01J 2237/2443; H01J 2237/24475
See application file for complete search history.

(56) References Cited

U.S. PATENT DOCUMENTS 5,557,105 A    9/1996   Honjo et al.
6,617,587 B2   9/2003   Parker et al.

FOREIGN PATENT DOCUMENTS

EP          1619495       1/2006

*Primary Examiner* — Nicole M Ippolito
*Assistant Examiner* — Hanway Chang (57) ABSTRACT

An electron microscope comprising:
- A specimen holder, for holding a specimen;
- An electron beam column, for producing an array of electron beams and concurrently irradiating an array of target areas of said specimen therewith;
- A scanning assembly, for producing relative scanning motion of said beam array with respect to the specimen;
- A detector, for detecting radiation emanating from the specimen in response to said irradiation, wherein said detector is:
- A backscattered electron detector that can be disposed proximal to the specimen at a side thereof facing said electron beam column;
- Provided with an array of apertures that allow passage of said electron beams from said column to the specimen;
- Provided with a functionally sub-divided detection surface that enables segregated detection of a backscattered electron flux produced by each individual beam.

15 Claims, 4 Drawing Sheets

MULTI-BEAM ELECTRON MICROSCOPE

FIELD OF THE INVENTION

The present invention relates to an electron microscope, and more particularly, to an electron microscope with a detector for detecting backscattered electrons from an array of electron beams.

BACKGROUND OF THE INVENTION

Electron microscopy is a well-known and increasingly important technique for imaging microscopic objects. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.
- A SEM can also be used in "transmission mode", e.g. when using relatively thin samples and a relatively high incident beam energy. Such a tool is often called a "TSEM" (Transmission SEM), and it will typically have a relatively rudimentary imaging system (e.g. a single lens and deflector) disposed between the specimen and post-specimen detector.

It should be noted that, in addition to imaging and performing (localized) surface modification (e.g. milling, etching, deposition, etc.), an electron microscope may also have other functionalities, such as examining diffractograms, conducting spectroscopy, studying ion channeling/ion backscattering (Rutherford Backscattering Spectrometry), etc.

In all cases, an Electron Microscope (EM) will comprise at least the following components:
- An electron source, such as a Field Emission Gun (FEG; Schottky or Cold FEG) or $LaB_6$ thermal source, for example.
- An illuminator (electron beam column), which serves to manipulate a "raw" radiation beam from said source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the specimen w.r.t. the beam. In general, such a specimen holder will be connected to a positioning system. When designed to hold cryogenic specimens, the specimen holder can comprise means for maintaining said specimen at cryogenic temperatures, e.g. using an appropriately connected cryogen vat.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

A transmission-type microscope, such as a (S)TEM or TSEM, will additionally comprise:
- An imaging system, which essentially takes electrons that are transmitted through a specimen (plane) and directs (focuses) them onto analysis apparatus, such as a detection/imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

Multi-beam electron microscopes—such as that specified above—are a relatively recent development, and are described, for example, in the Ph.D thesis "196 Beams in a Scanning Electron Microscope" by Ali Mohammadi-Gheidari, TU Delft, The Netherlands, November 2013:
   https://repository.tudelft.nl/islandora/object/uuid:
   98869173-12db-49cf-9466-
   0341cf6ad845?collection=research The basic idea behind the simultaneous use of several primary beams—as opposed to just a single beam—is that it promises significant throughput improvement, since the use of an array of beams allows "parallel imaging". However, the concurrent use of multiple imaging beams (beamlets; sub-beams; component beams) also presents various technical problems and challenges, which need to be addressed satisfactorily. One area in which such problems arise is detector architecture/methodology, which is the subject of the present invention.

SUMMARY

In one embodiment, an electron microscope comprises specimen holder, for holding a specimen; an electron beam column, for producing an array of electron beams and concurrently irradiating an array of target areas of said specimen therewith; a scanning assembly, for producing relative scanning motion of said beam array with respect to the specimen; and a detector, for detecting radiation emanating from the specimen in response to said irradiation, characterized in that said detector is a backscattered electron detector that can be disposed proximal to the specimen at a side thereof facing said electron beam column; provided with an array of apertures that allow passage of said electron beams from said column to the specimen; and provided with a functionally sub-divided detection surface that enables segregated detection of a backscattered electron flux produced by each individual beam. In this way, the backscattered electrons from each electron beam may be detected.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

In the Figures, where pertinent, corresponding parts are indicated using corresponding reference symbols.

DETAILED DESCRIPTION OF EMBODIMENTS

It is an object of the invention to provide an improved multi-beam electron microscope. More specifically, it is an object of the invention that such a microscope should enable satisfactory detection of imaging radiation species that are not effectively utilized in current multi-beam EM designs.

These and other objects are achieved in a microscope as set forth in the background section, characterized in that said detector is:
A backscattered electron detector that can be disposed proximal to the specimen at a side thereof facing said electron beam column;
Provided with an array of apertures that allow passage of said electron beams from said column to the specimen;
Provided with a functionally sub-divided detection surface that enables segregated detection of a backscattered electron flux produced by each individual beam.

As regards imaging electron detection, current multi-beam EM designs exploit:
Detection of transmitted bright-field electrons; or
Detection of secondary electrons that are accelerated into the particle-optical column.

For various reasons, it would be desirable to be able to accurately detect backscattered electrons (BSEs) in such tools. For example, BSEs generally come from greater sub-surface depths than secondary electrons, and they therefore provide more depth-related information. BSE yield values also give information on the atomic number constitution of the specimen. Also, BSEs tend to show preferential energies and/or emission angles as a function of depth, and can therefore serve as a useful basis for performing tomography. However, in the case of multi-beam EMs, BSE fluxes (with associated information) precipitated by the various input beams tend to become mixed/jumbled just a short distance above the specimen surface, e.g. of the order of just a few microns for typical beam array configurations (such as 14×14 beams at (specimen-level) orthogonal separations of ca. 3 μm, for example). Consequently, if a conventional BSE detection architecture is used, it will basically register a convoluted "mess" of BSEs.

The invention addresses these issues by locating a special BSE detector in close proximity to the specimen surface, so as to be able to capture individual BSE fluxes emerging from different primary beams before significant intermixing occurs. The (planar) detector is provided with an array of apertures/bores $\{A_{ij}\}$ that correspond in configuration/separation to the specimen-level array of beams, thus allowing each of these beams to pass through the detector on its way to the specimen (with a limited, but still sufficiently large, field of view). A body/bulk of the detector between these apertures is sensitized to BSEs intruding into the detector material from the specimen, and the detector is functionally sub-divided into an array of detection zones $\{Z_{ij}\}$—each associated with a given aperture $A_{ij}$—that can distinguish between/segregate BSE signals coming from two different zones (precipitated by the respective input beams passing through the apertures in those two zones). Further aspects of this architecture, and its use, will be elucidated below.

In an embodiment of the invention, the innovative detector comprises a Semiconductor Strip Detector having:
A sheet of semiconductor material, perforated by said apertures;
A bottom doped region, facing the specimen;
A top doped region, facing away from the specimen and sub-divided into an array of top cells, each associated with a given one of said apertures;
Detection circuitry, configured to register a flow of charge carriers to a given top cell, associated with localized impact of backscattered electrons in said sheet beneath said cell.

The basic mechanism behind such a detector is that BSEs passing through the semiconductor sheet produce electron-hole pairs therein. The bottom and top (complementarily $p^+/n^+$) doped regions have a natural excess of electrons/holes, and the extra electron-hole pairs produced by passage of the BSEs upset the equilibrium in these regions, e.g. causing promotion of some valence electrons into the conduction band, resulting in a current that can be measured by said detection circuitry. Because the top doped region is sub-divided (pixelated) into cells, each associated with a particular detection zone $Z_{ij}$ (see previous paragraph), it is possible to segregate/distinguish currents associated with specific detection zones $Z_{ij}$.

In the case of relatively low primary beam currents, which produce individual signal electrons that are spatially/temporally distinguishable, the structure of the previous paragraph can assume a particular form, wherein:
Said bottom doped region is sub-divided into an array of bottom cells, each associated with a given one of said apertures and arranged and linked in columns;
Said top cells are arranged and linked in rows;
Doped diode devices are formed between corresponding pairs of cells in said top and bottom doped regions, which devices can be individually addressed via selection of column/row coordinates.

Here, both the top and the bottom doped regions are pixelated, with a given detection zone $Z_{ij}$ located between a given pair of top and bottom pixels, which can be read-out via the associated row-column coordinates. Such an arrangement tends to be simpler to manufacture, since its row-column architecture simplifies the electrode structure associated with the top layer. See FIG. 3, for example.

In an alternative embodiment of the invention, the innovative detector comprises:
- A sheet of scintillator material, perforated by said apertures;
- An array of photon detectors, each functionally associated with a given aperture;
- Focusing optics, for accepting photons produced by localized impact of backscattered electrons in said scintillator material proximal a given aperture and directing them unto an associated photon detector.

This arrangement ultimately detects photons rather than charge carriers. BSEs impacting a given detection zone $Z_{ij}$ of the scintillator cause localized production of photons. These are collected and detected in such a way that photons originating from a given zone $Z_{ij}$ are consistently directed (by the focusing optics) to a dedicated photon detector associated with that zone. The employed photon detectors may be individual detectors (such as Solid State Photo-Multipliers, for example), or may alternatively be individual zones of a collective detection surface (as in the case of a zoned CCD/CMOS sensor, for example). The focusing optics may, for example, comprise a concave (elliptical) mirror, and waveguides (such as optical fibers) may also be employed in directing and segregating photons from different detection zones $Z_{ij}$. See FIG. 4, for example.

In an advantageous embodiment of the invention, the employed scanning assembly comprises a stage for producing scanning motion of the specimen holder in at least one direction. In conventional SEMs/STEMs, scanning motion is usually effected solely via beam deflection rather than specimen displacement. In the current invention, however, such conventional beam deflection would result in relatively large back-and-forth beam motion at specimen level, which would concurrently require the apertures in the inventive detector to be relatively wide (so as to accommodate the beam motion). Having relatively wide apertures means that the detection volume between them decreases in size; on the other hand, if the apertures could be kept relatively narrow, this would allow a relatively large detection volume between them. This requires the back-and-forth motional amplitude of the beams to be kept relatively small—which can be achieved if the desired relative scanning motion is (at least partially) produced by specimen displacement rather than beam deflection. The inventive detector can then be kept relatively stationary (or even fully stationary) with respect to the beam array, while the specimen is scanned beneath the detector. This specimen-scanning approach will require a specimen holder stage that is capable of accurately traversing a scan path; however, this does not have to present a technical hurdle, since sophisticated scanning stages are already used in fields such as lithography, and are available in many different implementations.

In a specific example of a scenario as described in the previous paragraph:
- Said stage is used to produce scanning motion of the specimen holder in a first direction;
- A beam deflector system is used to produce scanning motion of the beam array in a second, different direction.

Such a hybrid set-up is inter alia advantageous in that:
- Suitable choice of said first and second directions allows a resultant diagonal scanning motion, with a selectable direction/diagonal angle. This allows optimal space filling/packing for the linear tracts traced out by the primary beams in the array. See FIG. 5, for example.
- The fact that beam scanning need only be performed in a single direction means that there will either be no beam fly-back at all (if signal is recorded in dual directions) or that there will only be line fly-back—not frame fly-back—associated with the employed beam scanning deflector(s). This reduces deadtime.
- The amplitude of the specimen scanning motion can afford to be much greater than that of the beam scanning motion; accordingly, the specimen can effectively be scanned at a continuous velocity. This mitigates the need for stage reversals—with their associated settling time—and thus further reduces dynamic overhead/improves throughput.

In an embodiment of the invention, a positioning assembly is used to adjust and control a distance $d_{sd}$ between the employed detector and the specimen. As set forth above, this distance $d_{sd}$ generally needs to be kept relatively small (e.g. of the order of a few microns), so as to be able to catch BSEs generated by different primary beams in the array before they significantly intermix. When exploiting specimen scanning motion as set forth above, effects/deviations such as specimen bending/bowing and or surface roughness can lead to significant fluctuations in $d_{sd}$, with the risk of an overshoot (risk of BS mixing) or undershoot (risk of specimen/detector collision). The inventors have therefore built a set-up in which a positioning assembly/control loop are used to regulate the value of $d_{sd}$, so as to keep it within predefined boundary values. The basic idea here is that measured/predicted changes in $d_{sd}$ are corrected/pre-corrected on-the-fly by making appropriate adjustments to a positioning setpoint sent to the employed positioning assembly. Such an arrangement will typically make use of a separation/proximity sensor, which may, for example, comprise a capacitive sensor, inductive sensor, optical sensor, mechanical sensor, etc. In tests, the inventors found it useful to select a value of $d_{sd}$ that is less than or equal to five times the pitch (separation) of neighboring apertures in said array; so, for example, for an aperture pitch of 2 µm, one could choose $d_{sd}$ in a range of ca. 3-10 (e.g. 6) µm, for instance.

It is understood in the field of multi-beam EMs that the employed array of multiple primary electron beams can be conveniently generated by passing a progenitor electron beam through a multi-holed masking plate (spatial filter) having an array of openings within a footprint of the progenitor beam, e.g. as described in the Ph.D thesis referred to above. As regards the number of input beams in the beam array used in the present invention, it should be emphasized that this is discretionary. On the one hand, the greater the number of beams, the greater the throughput enhancement that can be achieved; on the other hand, a greater number of beams will increase overall system complexity. The skilled artisan will be able to find a compromise between these competing effects, and choose a number that is appropriate to a given scenario/use case. For example, one can construct a satisfactory system using 196 beams in a 14×14 array—though many other beam pluralities/configurations are possible.

If desired, the detector according to the present invention can be embodied in such a way as to be retractable out of the beam path, when desired. Such retractability may, for example, be useful in studies in which one is not specifically interested in BSE detection.

Embodiment 1

Figure 1:
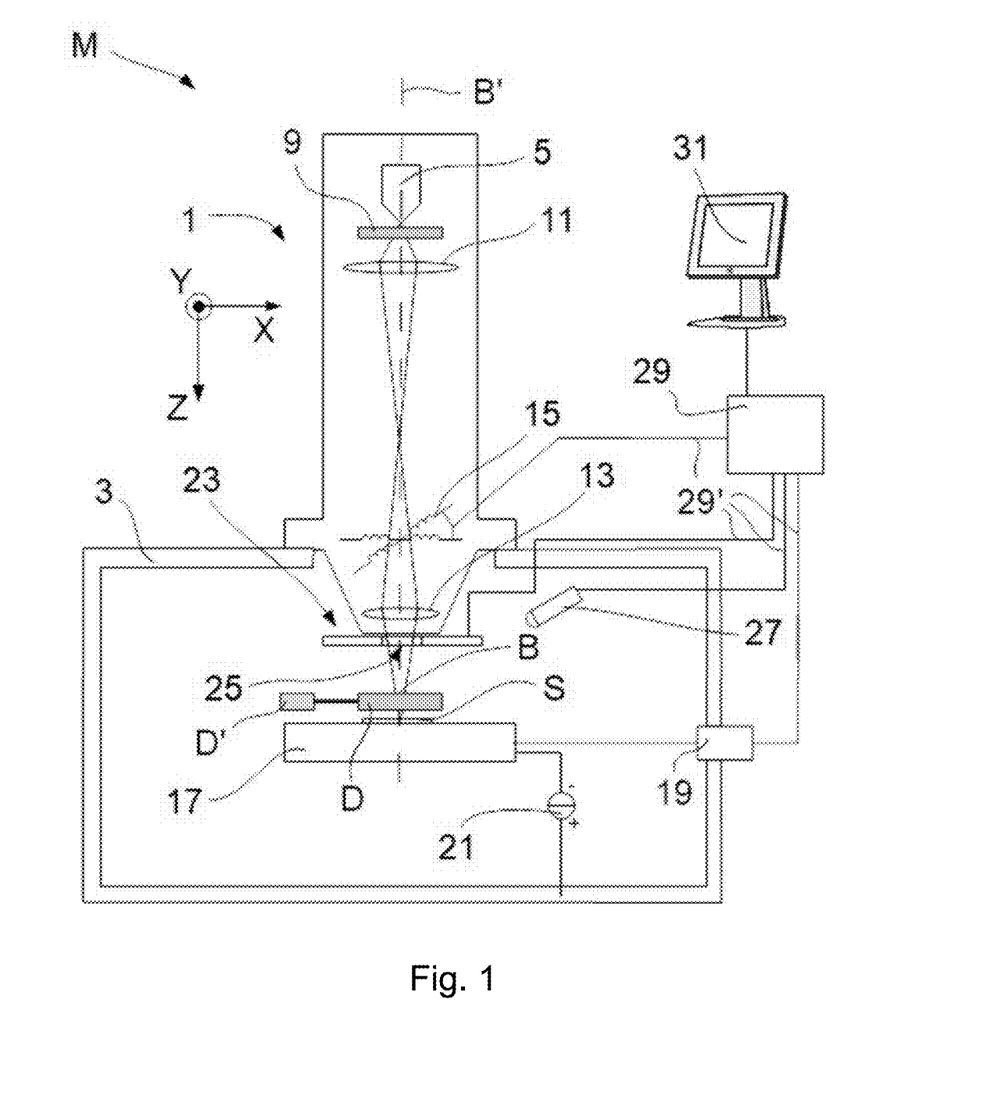
FIG. 1 renders a longitudinal cross-sectional elevation view of an embodiment of an electron microscope in which the present invention is implemented.

FIG. 1 (not to scale) is a highly schematic depiction of an embodiment of an electron microscope M in which the present invention can be exploited; more specifically, it shows an embodiment of a SEM (though, in the context of the current invention, it could also be a STEM, for example). The microscope M comprises an electron beam column/illuminator 1, which produces an electron beam that propagates along a particle-optical axis B'. The electron beam column 1 is mounted on a vacuum chamber 3, which comprises a specimen holder 17 and associated stage/actuator 19 for holding/positioning a specimen S. The vacuum chamber 3 is evacuated using vacuum pumps (not depicted). With the aid of voltage source 21, the specimen holder 17, or at least the specimen S, may, if desired, be biased (floated) to an electrical potential with respect to ground.

The electron beam column 1 comprises an electron source 5 (such as a Schottky emitter, cold FEG or $LaB_6$ filament, for example), lenses 11, 13 to focus the electron beam onto the specimen S, and a deflection unit 15 to perform beam deflection/scanning of the beam. The "conventional" detectors 23, 27 can be chosen from a variety of possible detector types that can be used to examine different types of output radiation emanating from the specimen S. In the apparatus depicted here, the following detector choices have been made:

Detector 23 is a segmented electron detector, comprising a plurality of independent detection segments (e.g. quadrants) disposed about a central aperture 25 (encompassing the optical axis B'). Such a detector can, for example, be used to investigate the angular dependence of a flux of electrons emerging from the specimen S.

Detector 27 is, for example, an X-ray detector, which can be used to register X-rays emanating from the specimen S, and thus perform Energy-Dispersive X-ray Spectroscopy (EDX). It could alternatively be a cathodoluminescence detector, for example.

By scanning an electron beam over the specimen S, output radiation—comprising, for example, a flux of X-rays, infrared/visible/ultraviolet light, secondary electrons and/or BSEs—emanates from the specimen S. Since such output radiation is position-sensitive (due to said scanning motion), the information obtained from the detectors 23, 27 will also be position-dependent, and can thus be used to assemble an image that is basically a map of detector output as a function of scan-path position on the specimen S. The signals from the detectors 23, 27 pass along control lines (buses) 29", are processed by the controller 29, and displayed on display unit 31. Such processing may include operations such as combining, integrating, subtracting, false colouring, edge enhancing, and other processing known to the skilled artisan. In addition, automated recognition processes (e.g. as used for particle analysis) may be included in such processing.

Various refinements and alternatives of such a "basic" set-up will be known to the skilled artisan, including, but not limited to:

The use of dual primary beam species—for example an electron beam for imaging and an ion beam for machining (or, in some cases, imaging) the specimen S;

The use of a controlled environment at the specimen S—for example, maintaining a pressure of several mbar (as used in a so-called Environmental SEM) or by admitting gases, such as etching or precursor gases.

Figure 2:
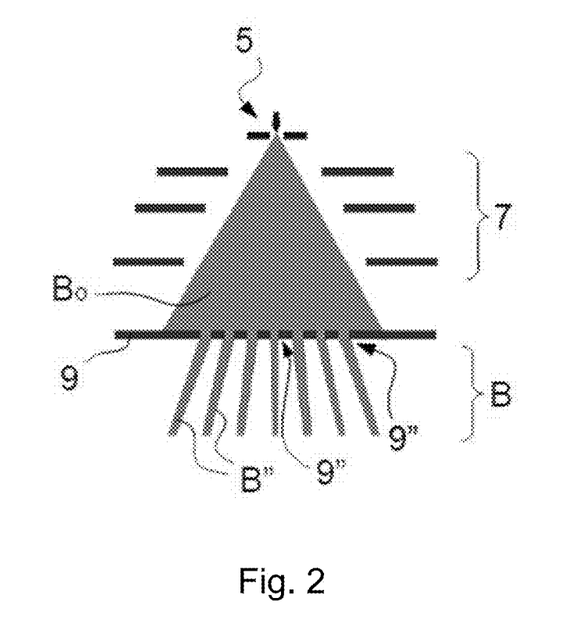
FIG. 2 illustrates a manner in which an electron beam array can be generated from a single progenitor beam.

Of importance to the present invention is a refinement whereby a single primary electron beam is replaced by a multi-beam array. FIG. 2 shows how such a multi-beam array can be generated, using a relatively small modification to FIG. 1. A progenitor electron beam B, leaves the electron source 5, traverses a series of (extraction/acceleration) electrodes 7, and impinges upon a masking plate 9, which contains multiple small holes 9"; such a structure 9 can also be referred to as an Aperture Lens Array (ALA), and can, for example, be manufactured by using thin film technology to etch an array of microscopic holes in a silicon sheet. As a result of impinging on the ALA 9, the progenitor beam B, is converted into an array B of sub-beams/beamlets/component beams B", in the same geometric configuration as the array of holes 9" used to generate them. This beam array B then follows its course along axis B' through the illuminator 1, which directs it onto the specimen S (see FIG. 1).

Figure 3:
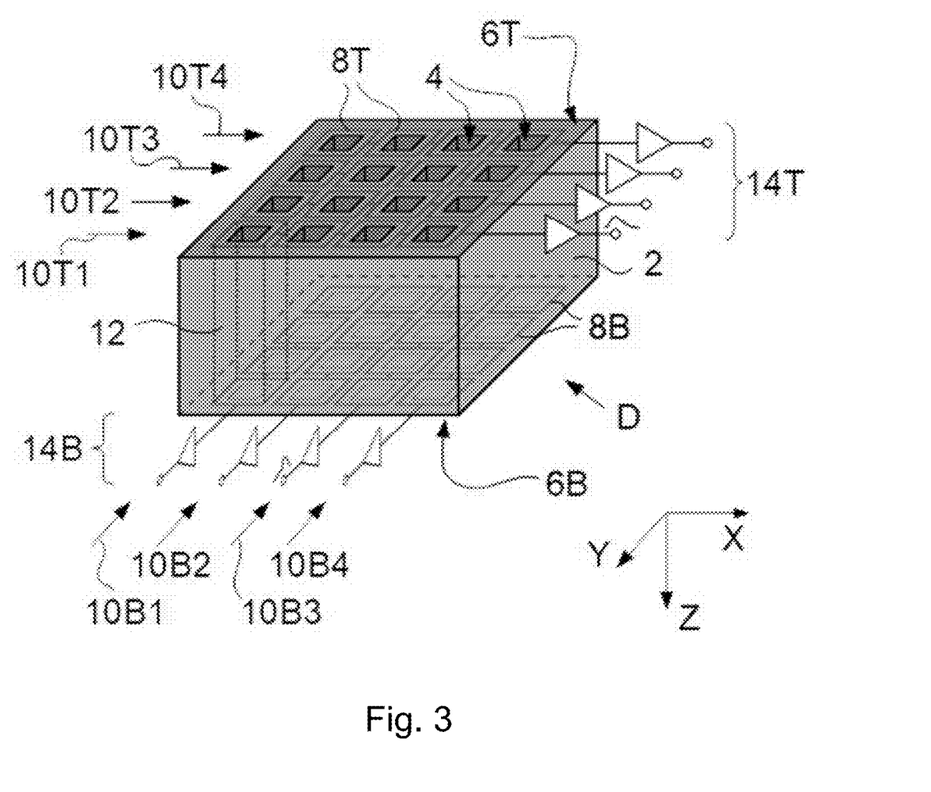
FIG. 3 depicts a magnified perspective view of an embodiment of a detector D as shown in FIG. 1.

Because specimen S is now concurrently irradiated by an array B of beams rather than a single beam, spatially resolved detection of induced radiation emanating from the specimen S becomes a challenge. More specifically, conventional sensing devices such as detectors 23, 27 in FIG. 1 generally cannot satisfactorily perform such detection. To address this issue, the present invention uses a modified detector D (see FIGS. 1 and 3), which is:

A backscattered electron (BSE) detector that is disposed proximal to the specimen S at a side thereof facing the electron beam column 1;

Provided with an array of apertures 4, each of which allows passage of a respective electron beam B" from the column 1 to the specimen S;

Provided with a functionally sub-divided detection surface (6B, 8B; 6T, 8T) that enables (allows for; produces) segregated detection of a backscattered electron flux precipitated by each individual beam B".

In more detail, FIG. 3 shows a Si sheet 2 with a thickness of ca. 20-50 µm, which has an array of apertures 4 etched therein, creating mini-tunnels that extend through the sheet 2 in the Z direction. In this particular case, the apertures 4 have a width (in the XY plane) of ca. 1 µm, and a mutual separation/pitch ($s_a$) along the X and Y axes of ca. 5 µm. As here depicted, the apertures 4 have a square cross-section, but this is not limiting, and other cross-sections (such as circular or polygonal, for example) would also be acceptable. The apertures 4 can, for example, be created in the sheet 2 by a masking/etching process, e.g. as commonly applied in the semiconductor industry.

Using (for example) ion implantation techniques, thin ($p^+/n^+$) doped regions 6B and 6T are formed at the bottom and top surfaces of the sheet 2, respectively. These regions 6B, 6T may, for example, have a thickness of ca. 100 nm, and comprise boron, phosphorous or arsenic as implant/dopant atoms, at a concentration of $10^{15}$-$10^{18}$ $cm^{-3}$, for instance. In this particular embodiment:

Bottom ($n^+$ or $p^+$) doped region 6B (facing the specimen S) has been sub-divided into an array of bottom cells 8B, each associated with a given one of the apertures 4, and each provided with a perimetric ring electrode. These cells 8B are arranged and linked in columns 10B1, 10B2, 10B3, 10B4, etc.

Top ($p^+$ or $n^+$) doped region 6T (facing away from the specimen S) has been sub-divided into an array of top cells 8T, each associated with a given one of the apertures 4, and each provided with a perimetric ring electrode. These cells 8T are arranged and linked in rows 10T1, 10T2, 10T3, 10T4, etc.

Between each pair of bottom and top cells, there is a detection zone 12. This can also be labeled $Z_{ij}$ in the case of the zone 12 between bottom cell 10$_i$ and top cell 10T$_j$, for example.

Such a structure constitutes an array of PIN diodes. The skilled artisan will understand that the shape of doped regions 6B, 6T can be matched/tailored to the strip-like column/row geometry in the current setup. These regions may, if desired, correspond in shape/size to the abovementioned ring electrodes. Also, the cells 8B/8T do not necessarily have to be linked in columns/rows; instead, they may be isolated from one another, and read out separately using dedicated, individual wiring lanes.

As shown in FIG. 1, the underside of detector D is disposed close to the upper surface of specimen S, typically with a separation ($d_{sd}$) between them of the order of a few microns. To maintain this separation, the present embodiment employs a positioning assembly D'—connected to detector D—for adjusting and controlling the value of $d_{sd}$, e.g. to cope with non-level topography of the upper surface of specimen S as it is scanned (by stage 19) below detector D. This positioning assembly D' can be used to:

Measure real-time values for $d_{sd}$, e.g. using capacitive, inductive or optical distance measurement techniques;
Use one or more actuators (which may, for example, comprise piezoelectric motors, voice coil motors, etc.) to perform on-the-fly correction/stabilization of each measured value of $d_{sd}$, so as to keep it within a specified range/essentially constant. A feedback and/or feedforward control loop may be used for this purpose.

As a non-binding example: the inventors have found that ~3 µm≤$d_{sd}$≤~6 µm gave satisfactory results in various performed tests.

Figure 4:
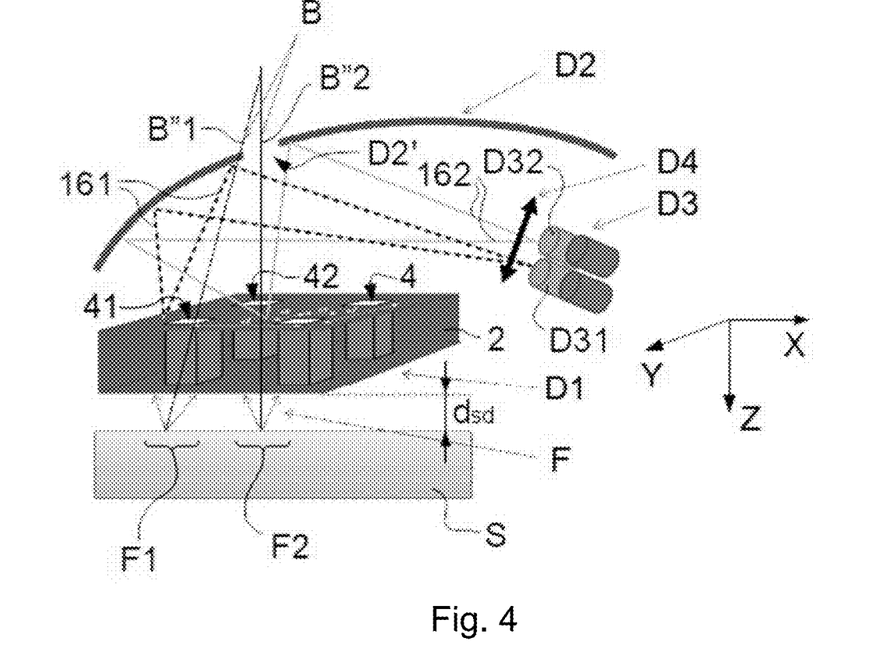
FIG. 4 shows a magnified perspective view of an alternative embodiment of a detector D as shown in FIG. 1.

The inventive structure shown and described here allows the individual BSE flux F produced by each distinct beam B" (not explicitly depicted here, but see the analogous situation in FIG. 4) to be separately registered by detection circuitry 14B, 14T connected to (columns and rows of) the detector D. For example, a primary electron beam B" passing through front left aperture at coordinates (10B1, 10T1) will, when it impacts the specimen S, precipitate a BSE flux F that will produce a measurable excess of electron-hole pairs in detection zone 12, leading to an electrical signal that can be traced to those distinct column/row coordinates.

Embodiment 2

FIG. 4 shows an alternative embodiment of the present invention, in which the employed detector (D1, D2, D3, D4) has a different architecture and operating mechanism. Similar to the situation illustrated in FIG. 3, the detector in the present embodiment comprises a sheet 2 (D1) in which an array of apertures 4 are present; however, in the present situation, this sheet 2 comprises scintillator material, such as a YAG (Yttrium Aluminium Garnet) scintillator, for example. As in FIG. 3, this sheet 2 is disposed proximal to the specimen S, e.g. within about five microns thereof. Explicitly shown in FIG. 4 are two primary electron beams B"1, B"2 in the array B, which respectively pass through two different apertures 41, 42 in the sheet 2 and impinge upon two different localities of the specimen S, respectively producing BSE fluxes F1, F2. These fluxes F1, F2 enter the scintillator sheet 2, where they precipitate localized photon emissions in the scintillator material in the vicinity of the respective apertures 41, 42 through which they passed. These photon emissions are collected/re-directed by focusing device D2, which in the current case is an elliptical mirror having an opening D2' through which the primary beam array B can pass. The focusing device D2 directs the photon emissions onto an array D3 of photon detectors, whilst keeping the different photon emissions mutually segregated: for example:

Rays 161 (dashed lines) illustrate the path taken by photons originating in the vicinity of aperture 41, which are directed onto photon detector D31;
Rays 162 (solid lines) illustrate the path taken by photons originating in the vicinity of aperture 42, which are directed onto photon detector D32.

Also illustrated is a lens D4, which can adjust a magnification of the emissions impinging on the detector array D3. As in Embodiment 1, a positioning assembly (D'; not depicted) can be connected to sheet D1 and used to adjust/control the value of $d_{sd}$.

Embodiment 3

Figure 5:
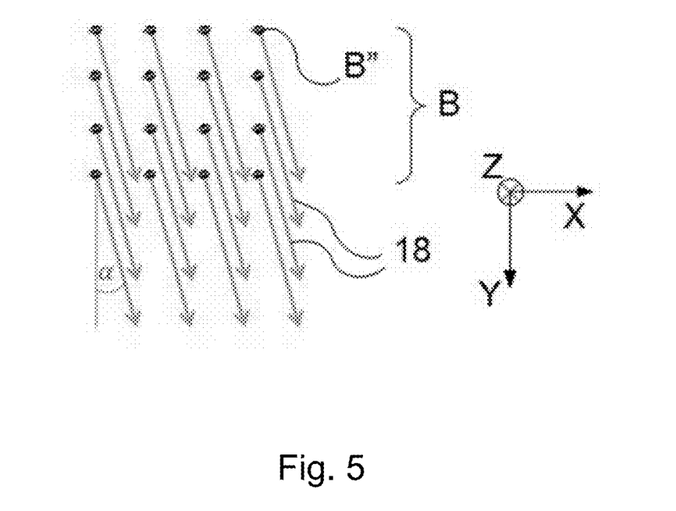
FIG. 5 illustrates a potential scanning scheme in an embodiment of the invention.

FIG. 5 renders a plan view of the beam array B in an embodiment of the present invention. In this particular case, the array B has an orthogonal geometry, though this does not necessarily have to be so chosen. As here depicted, a net/resultant scan direction at diagonal angle α has been selected, which gives a good packing density of the scan lines/tracts 18 traced out by the individual beams B". Assuming the array B to comprise N×N beams B" (N=4 in the current illustration), then one can, for example, choose:

$$\tan \alpha = 1/N$$

One can, for example, effect the scanning motion at angle α using pure specimen motion, with beam deflection producing only a very small-amplitude deflection in a direction perpendicular hereto.

The invention claimed is:
1. An electron microscope comprising:
A specimen holder, for holding a specimen;
An electron beam column, for producing an array of electron beams and concurrently irradiating an array of target areas of said specimen therewith;
A scanning assembly, for producing relative scanning motion of said beam array with respect to the specimen; and
A detector, for detecting radiation emanating from the specimen in response to said irradiation,
wherein said detector is:
A backscattered electron detector that can be disposed proximal to the specimen at a side thereof facing said electron beam column;
Provided with an array of apertures that allow passage of said electron beams from said column to the specimen; and
Provided with a functionally sub-divided detection surface that enables segregated detection of a backscattered electron flux produced by each individual beam, and wherein said detector comprises:
A sheet of scintillator material, perforated by said apertures;
An array of photon detectors, each functionally associated with a given aperture; and
Focusing optics, for accepting photons produced by localized impact of backscattered electrons in said scintillator proximal a given aperture and directing them unto an associated photon detector.

2. The microscope according to claim 1, wherein said focusing optics comprise a mirror.

3. The microscope according to claim 2, wherein said mirror having an opening for a primary electron beam array to pass through.

4. The microscope according claim 1, wherein said scanning assembly comprises a stage for producing scanning motion of the specimen holder in at least one direction.

5. The microscope according to claim 4, wherein said microscope comprises:
Said stage, for producing scanning motion of the specimen holder in a first direction;
A beam deflector system, for producing scanning motion of said beam array in a second, different direction.

6. The microscope according to claim 5, wherein an amplitude of the scanning motion in said second direction is smaller than that of the scanning motion in said first direction.

7. The microscope according to claim 1, further comprising a positioning assembly for adjusting and controlling a distance between said detector and specimen.

8. The microscope according to claim 7, wherein said positioning assembly consists of a separation sensor selected from the group comprising a capacitive sensor, an inductive sensor, an optical sensor, a mechanical sensor, and combinations hereof.

9. The microscope according to claim 1, wherein a separation between the detector and specimen is less or equal to five times the pitch of neighboring apertures in said array.

10. The microscope according to claim 1, wherein said array of electron beams is generated by directing a progenitor electron beam onto a masking plate having an array of openings within a footprint of the progenitor beam.

11. A method of using an electron microscope comprising:
Providing a specimen holder for holding a specimen;
Disposing a detector proximal to the specimen holder at a side thereof facing an electron beam column;
Producing an array of electron beams via said electron beam column, wherein said electron beams pass from said electron beam column to the specimen through an array of apertures in said detector to concurrently irradiate an array of target areas of said specimen; and
Detecting radiation emanating from the specimen in response to said irradiation using a functionally sub-divided detection surface in the detector to produce concurrent segregated detection of a backscattered electron flux produced by each individual beam, and wherein said detector comprises:
A sheet of scintillator material, perforated by said apertures;
An array of photon detectors, each functionally associated with a given aperture; and
Focusing optics, for accepting photons produced by localized impact of backscattered electrons in said scintillator proximal a given aperture and directing them unto an associated photon detector.

12. The method according to claim 11, wherein said focusing optics comprise a mirror.

13. The method according to claim 11, wherein disposing the detector proximal to the specimen holder at the side thereof facing said electron beam column includes disposing the detector from the specimen at a distance less or equal to five times a pitch of neighboring apertures in said array of apertures.

14. The method according to claim 11, further comprising producing scanning motion of the specimen holder in a first direction with a stage; and producing scanning motion of said beam array in a second, different direction with a beam deflector system.

15. An electron microscopic comprising:
A specimen holder, for holding a specimen;
An electron beam column, for producing an array of electron beams and concurrently irradiating an array of target areas of said specimen therewith;
A scanning assembly, for producing relative scanning motion of said beam array with respect to the specimen; and
A detector, for detecting radiation emanating from the specimen in response to said irradiation, wherein said detector is:
A backscattered electron detector that can be disposed proximal to the specimen at a side thereof facing said electron beam column;
Provided with an array of apertures that allow passage of said electron beams from said column to the specimen; and
Provided with a functionally sub-divided detection surface that enables segregated detection of a backscattered electron flux produced by each individual beam, and wherein said detector comprises a Semiconductor Strip Dector having:
A sheet of scintillator material, perforated by said apertures;
A bottom doped region, facing the specimen, said bottom doped region is sub-divided into an array of bottom cells, each associated with a given one of said apertures and arranged and linked in columns;
A top doped region, facing away from the specimen and sub-divided into an array of top cells, each associated with a given one of said apertures, said top cells are arranged and linked in rows, and doped diode devices are formed between corresponding pairs of cells in said top and bottom doped region, which doped diode devices can be individually addressed via selection of column/row coordinates; and
Detection circuitry, configured to register a flow of change carriers to a given top cell, associated with localized impact of backscattered electrons in said sheet beneath said cell.

* * * * *